(12) United States Patent
Tomuta et al.

(10) Patent No.: US 8,269,187 B2
(45) Date of Patent: Sep. 18, 2012

(54) ELECTRON BOMBARDED IMAGE SENSOR ARRAY DEVICE AND ITS MANUFACTURING METHOD

(75) Inventors: Daniela Georgeta Tomuta, Groningen (NL); Albert Hendrik Jan Meinen, Groningen (NL); Gezinus Ruiter, Roden (NL); Jan Van Spijker, Roden (NL)

(73) Assignee: Photonis-Dep B.V., Roden (NL)

( * ) Notice: Subject to any disclaimer, the term of this patent is extended or adjusted under 35 U.S.C. 154(b) by 155 days.

(21) Appl. No.: 11/922,104

(22) PCT Filed: Jun. 13, 2006

(86) PCT No.: PCT/EP2006/005655
§ 371 (c)(1),
(2), (4) Date: Dec. 13, 2007

(87) PCT Pub. No.: WO2006/133891
PCT Pub. Date: Dec. 21, 2006

(65) Prior Publication Data
US 2009/0206265 A1    Aug. 20, 2009

(30) Foreign Application Priority Data
Jun. 14, 2005 (EP) .................................. 05076385

(51) Int. Cl.
*G01T 1/185* (2006.01)
(52) U.S. Cl. ...................................................... 250/389
(58) Field of Classification Search ............. 250/370.14, 250/389
See application file for complete search history.

(56) References Cited

U.S. PATENT DOCUMENTS

| | | | |
|---|---|---|---|
| 5,200,363 A | 4/1993 | Schmidt et al. | |
| 6,020,646 A * | 2/2000 | Boyle et al. | 257/783 |
| 6,281,572 B1 * | 8/2001 | Robbins | 257/700 |
| 6,611,055 B1 | 8/2003 | Hashemi | |

FOREIGN PATENT DOCUMENTS

| | | |
|---|---|---|
| EP | 0 602 983 A | 6/1994 |
| WO | WO-01/15237 A1 | 3/2001 |
| WO | WO-03/019653 A2 | 3/2003 |
| WO | WO 2004093194 A1 * | 10/2004 |

OTHER PUBLICATIONS

Joram, "Large area hybrid photodiodes," Nuclear Physics B, Proceedings Supplements, vol. 78, 1999, pp. 407-415, XP002348343, ISSN: 0920-5632.

* cited by examiner

*Primary Examiner* — Christine Sung
(74) *Attorney, Agent, or Firm* — Muncy, Geissler, Olds & Lowe, PLLC (57) ABSTRACT

The invention relates to an electron bombarded image sensor array device comprising a vacuum chamber having a photocathode capable of releasing electrons into said vacuum chamber when exposed to light impinging on said photocathode, a photocathode capable of releasing electrons into said vacuum chamber when exposed to light impinging on said photocathode, electric field means for accelerating said released electrons from said photocathode towards an anode spaced apart from said photocathode in a facing relationship to receive an electron image from said photocathode, said anode being constructed as a back-thinned image sensor array having electric connecting pads distributed according to a pattern along the surface area of said sensor facing away from said photocathode, a carrier on which said image sensor array is mounted, said carrier having electric connecting pads distributed according to a pattern to feed electric signals from said image sensor array outside said vacuum chamber and electric connecting means for electrically connecting at least one of said electric connecting pads of said image sensor array with at least one of said electric connecting pads of said carrier.

14 Claims, 6 Drawing Sheets

ELECTRON BOMBARDED IMAGE SENSOR ARRAY DEVICE AND ITS MANUFACTURING METHOD

The invention relates to an electron bombarded image sensor array device comprising a vacuum chamber having a photocathode capable of releasing electrons into said vacuum chamber when exposed to light impinging on said photocathode, a photocathode capable of releasing electrons into said vacuum chamber when exposed to light impinging on said photocathode, electric field means for accelerating said released electrons from said photocathode towards an anode spaced apart from said photocathode in a facing relationship to receive an electron image from said photocathode, said anode being constructed as a back-thinned image sensor array having electric connecting pads distributed according to a pattern present on the surface area of said sensor facing away from said photocathode, a carrier on which said image sensor array is mounted, said carrier having electric connecting pads distributed according to a pattern to feed electric signals from said image sensor array outside said vacuum chamber and electric connecting means for electrically connecting at least one of said electric connecting pads of said image sensor array with at least one of said electric connecting pads of said carrier.

In this case, the anode is being constructed as a back thinned image sensor array (ISA) die mounted with the back-thinned side facing the photocathode to receive the electron image. Due to the fact that the ISA die is made custom off the shelf, the die contact pads are distributed according to a pattern along the peripheral front surface area, that is facing away from the photocathode. In the prior art, the back-thinned image sensor array is mounted onto an intermediate carrier because of its very thin feature, e.g. the back bombarded or illuminated image sensor arrays are mostly thinned down to 10-20 microns.

The present invention relates to an image sensor device assembly build by a carrier and a die, connected to each other by dedicated connecting means (bonded to each other) using improved connecting means (or using a new bonding method/material). The dedicated connection means includes an interconnection and electric connection between the contact pads of the image sensor array die and the contact pads of the carrier when using metallic bumps and/or adhesive underlying layer to be used when the carrier and the image sensor array dies, on wafer level, are bonded to each other.

The present invention relates to a dedicated carrier, sensor specific, having its electric connecting pads distributed according to a pattern, on first instance congruent to or overlapping with the image sensor array contact pads in order to feed electric signals from the image sensor array to a further ultra high vacuum (UHV) tight header or support and finally outside the vacuum chamber without use of a wire bonding technique.

The electric connecting means of the carrier are electrically connecting at least one of the electric connecting pads of the sensor with at least one of the electric connecting pads of the carrier, last being further extended to a metallic contact using through carrier metallic channels or via's.

A device according to the above preamble is for example known from the U.S. Pat. No. 4,687,922. In the prior art, one mounting method includes ball bonding the die to a carrier using frit glass (see for example U.S. Pat. No. 6,020,646). Both construction methods show a final wire bonding of the carrier to UHV header or to (some) conductive tracks outside the vacuum chamber.

In U.S. Pat. No. 4,687,922 the image sensor array is provided with electric connecting pads, which are electrically connected to the electric connecting pads of the carrier using electric conducting means, which are directed or guided away from the image sensor array.

More in particular the electric connecting pads of the image sensor array are connected with the electric connecting pads of the carrier using conductive tracks supported by a carrier and finally wire bonded to vacuum-tight electric current leads. Due to the high electric field necessary to image the photo-electrons on to the backside of the image sensor array (ISA), this construction with wire bonds requires significant constructional dimensions resulting in an enlarged electron bombarded image sensor array device limiting its applications in specific technical fields.

The invention obviates the above identified drawbacks and provides an electron bombarded electron bombarded image sensor array device as well as a dedicated carrier having a construction with limited dimensions.

According to the invention, said electric connecting pads of said carrier are distributed along a surface area of said carrier facing away from said image sensor array.

With an electron bombarded image sensor array device according to the invention, it is no longer necessary to guide the electric signal collected by the image sensor array contact pads away from the sensor using wire bonding as in the prior art.

In a first embodiment the surface area of the carrier is identical to the surface area of the image sensor array, where in a second embodiment said surface area of said carrier is larger than the surface area of the image sensor array.

More in particular in a specific embodiment, said electric connecting means comprise first auxiliary electric connecting pads distributed according to a first auxiliary pattern, said first auxiliary pattern being mirrored to the pattern of the electric contact pads of the image sensor.

With this specific embodiment the first auxiliary electric connecting pads can be distributed for example along the surface area of said carrier facing towards the image sensor array.

In another functional embodiment said electric connecting means comprise second auxiliary electric connecting pads distributed according to a second auxiliary pattern, said second auxiliary pattern being equal to the pattern of said electric connecting pads of said carrier. More in particular said second auxiliary electric connecting pads are distributed along the surface area of said carrier facing towards said image sensor array die.

These two different embodiments described above describe two advantageous solutions for the re-distribution of the electrical connection between the image sensor array and the vacuum header, resulting in a significant reduction of the structural dimensions of the electron bombarded active pixel (device).

Furthermore, in a specific embodiment according to the invention said electric connecting means comprise electric connecting leads for connecting said first auxiliary electric connecting pads with said second auxiliary electric connecting pads and/or said electric connecting pads of said carrier.

More in particular said electric connecting leads extend at least partly in a direction parallel and/or perpendicular to the plane of the carrier.

The invention will now be described more clearly in the following description using the accompanying drawings. Various features of the drawings are not drawn to scale. Like numerals are used to represent like elements in the Figures.

Figure 1:
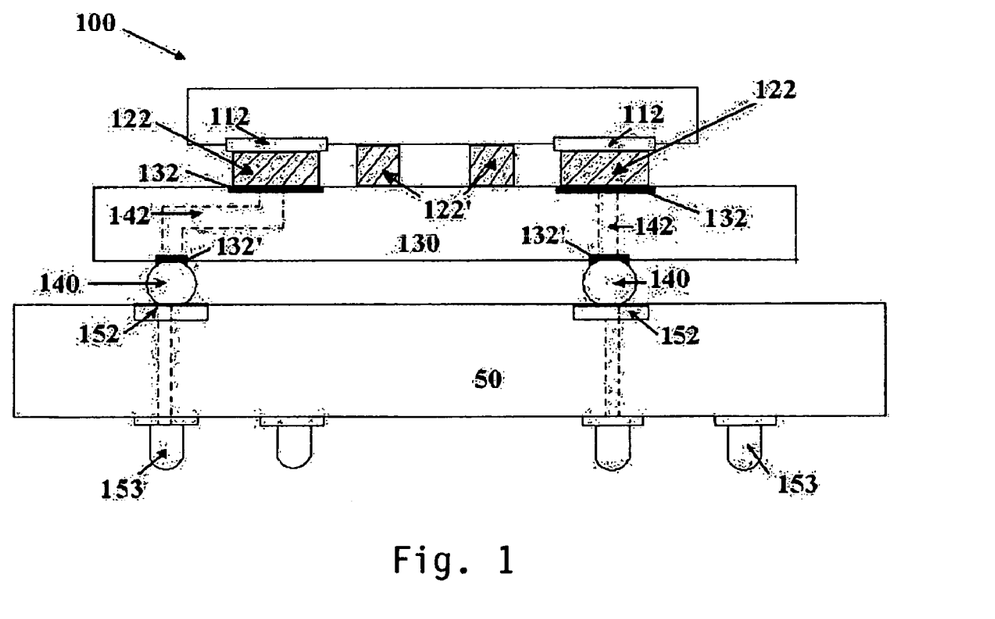
FIG. 1 a first embodiment of an image sensor array die according to the invention.

FIG. 1 shows a diagrammatic view of an image sensor array (ISA) device of a back thinned image sensor array die 100 based on prior art mounting means. In the preferred embodiment, the image sensor array die 100 is on first instance thinned to a thickness of 10-20 microns on wafer scale prior to the mounting in the present embodiment. The total assembly 100 includes a fully back thinned image sensor array (ISA) die 100, the front side of which is mechanically attached to a carrier 130, via electrical 122 and non-electrical contact bumps 122' means.

The contact bumps 122 and as the case is 122' fulfill the electrical and mechanical connection between the image sensor array die contact pads 112 and the contact pads 132 of the carrier 130. The only particularity of this embodiment lies in the design of the carrier 130. The carrier 130 can have any dimension, its surface being larger, equal or smaller than of the chosen sensor array. The auxiliary pattern of the contact pads 132 of the carrier 130 created on its front surface is restricted to the design and specification of the image sensor array contact pads 112.

The conductive pads 132 of the carrier 130 are congruent to or overlapping the conductive pads 112 of the image sensor array die 100. The same carrier 130 also includes enlarged/extended contact pads 132' on its back side which are directly electrically connected to their corresponding contact pads 132 from the front surface, thus finally to the image sensor array contact pads 112 via the bumps 122. The metallic contact pads 132' are of sufficient size to accommodate further bonding balls 140, which in this case make the final connections to the UHV header 50 via the UHV connecting pads 152.

The carrier 130 requires materials with a thermal expansion coefficient close to Si: e.g. Si itself, Low Temperature Cofired Ceramics (LTCC) or glass. Said carrier has metallic via or channels through the entire thickness. In this case, the carrier has a predefined structure, containing individual metallic feedthrough's from the front side contact pads to their corresponding contact point on the back side.

More in particular the metallic feedthrough's of said electric connecting leads extend at least partly in a direction parallel and/or perpendicular to the plane of the carrier surface. The materials used to fabricate such a dedicated carrier 130 are high vacuum qualified, e.g. must not outgas and keep their properties while processed in high vacuum and high temperature conditions.

Although the present embodiment requires a dedicated carrier 130, which increases the final device costs, it has the unique advantage of avoiding the wire bond connections, thus being ideally suited for proximity vacuum tubes having a photocathode in close proximity to the image sensor array die.

Figure 2:
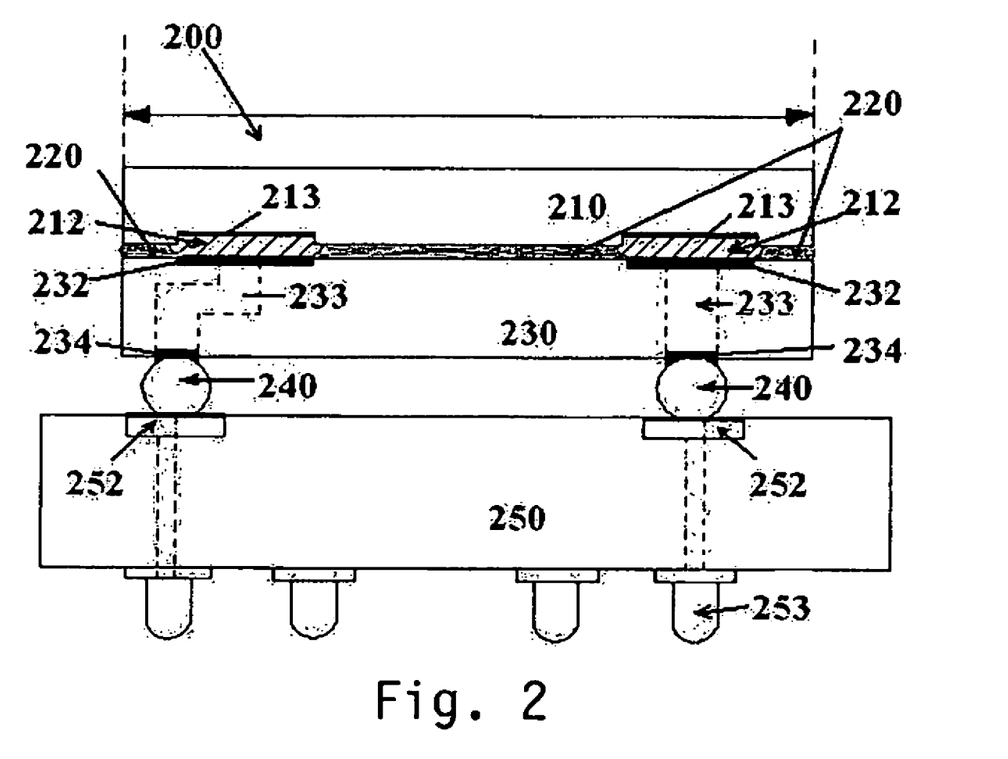
FIG. 2 a second embodiment of an image sensor array die according to the invention.

In FIG. 2, a similar schematic view of an back bombarded device is presented as individual device assembly containing an individual image sensor array back-thinned die and the corresponding (dedicated) carrier. FIG. 2 illustrates a method according to the present invention that allows a wafer scale processing for such a final device according to the following steps:

A providing a silicon wafer substrate;
B depositing and etching subsequent layers of semiconductor materials thereby forming said at least one image sensor array on said wafer substrate;
C applying one or more electric connecting pads to said at least one image sensor array;
D providing a carrier wafer substrate;
E applying one or more electric connecting pads to said carrier;
F applying electric connecting means to said carrier intended for electrically connecting said one or more electric connecting pads of said at least one image sensor array with said one or more electric connecting pads of said carrier;
G mounting said silicon wafer substrate and said carrier wafer substrate such that said one or more electric connecting pads of said at least one image sensor array is electrically connected with said one or more electric connecting pads of said carrier through said electric connecting means, thereby forming an image sensor array-carrier substrate;
H thinning a surface of said at least one image sensor array facing away from said carrier wafer substrate.

With the method according to the invention a manufacturing process for back thinned image sensor arrays on a wafer scale basis is obtained.

Furthermore the method according to the invention may comprise the step of

I separating/dicing said at least one image sensor array from the package assembly, said step may be performed prior to step G as a pre-dicing step or after step H.

After explaining the whole wafer scale process map, individual assemblies, formed from one single back thinned image sensor array die and its dedicated carrier, are implemented finally in the vacuum tubes, with the help of the UHV headers. Between FIG. 1 and FIG. 2 there are no major differences, as FIG. 2 contains a carrier-sensor minimized assembly. The thinned image sensor array 210 is diced from the wafer package as described above.

Before the bonding step, an under bump metallization process is performed represented by small bumps 212 as extended contact pads perfectly following the features of the initial sensor contact pads 213. The carrier 230 is prepared prior to the final bonding by applying a thin layer of photoresist material 220, which must be compatible by outgassing means with the photocathode processing steps for an electron bombarded image intensifier vacuum tube.

A mask copying the image sensor array contact pads is used to expose the wafer carrier, creating the carrier contact pads 232 from the front end surface. The photoresist layer 220 is then developed and following the created auxiliary pattern. On one front end, the existing metallic contact pads 234 are redistributed within a corresponding available surface, matching perfectly the image sensor surface. Detailed overviews of some possibilities for the redistribution are presented on FIGS. 4a-4c below.

The feedthrough's 142-233 have on the front end of the carrier wafer an opening of about 100 microns, and the pattern is identical with the image sensor contact pads, while on the other end side, their contact surface is enlarged to about 300 microns, well suited for a metallic ball bonding 140-240 to the UHV header 250 using the UHV header leads 252. The photoresist layer 220 can be now used as an intermediate bonding component 220.

The wafer carrier and the sensor wafer are perfectly aligned on top of each other and with the help of the photoresist layer 220 and following the prescribed phase diagram, the whole package is heated and pressed until the bonding is realized. The wafer package formed is thinned down on the Si wafer side to the desired thickness, having enough strength and being mechanically stable even for reaching 10 microns of the Si initial wafer.

Finally, individual assemblies of image sensor arrays and their matching carriers are diced from the wafer package and mounted using metallic balls, e.g. made from In, to the UHV header 50-250. The method described offers at least two major advantages, 1) a wafer scale processing for obtaining back thinned image sensor devices in 10 microns thickness range and 2) a sealed protection of the metallic parts existing on the Si wafer front side while being exposed to lapping and grinding the back side.

In the embodiments of FIGS. 1 and 2 the carrier 130-230 is mounted to a UHV vacuum header 50, which header 50 forms an integral part of the vacuum chamber in which the assembly consisting of the image sensor array 100-210 and the carrier 130-230 is accommodated. The image sensor array 100-210 is electrically connected to the carrier 130-230, which in turn is electrically connected to the UHV vacuum header 50 using the electric connecting means 132-142-132'; 232-233-234. All electric signals are fed outside the vacuum chamber for further processing via the connecting leads 153-253.

Figure 5:
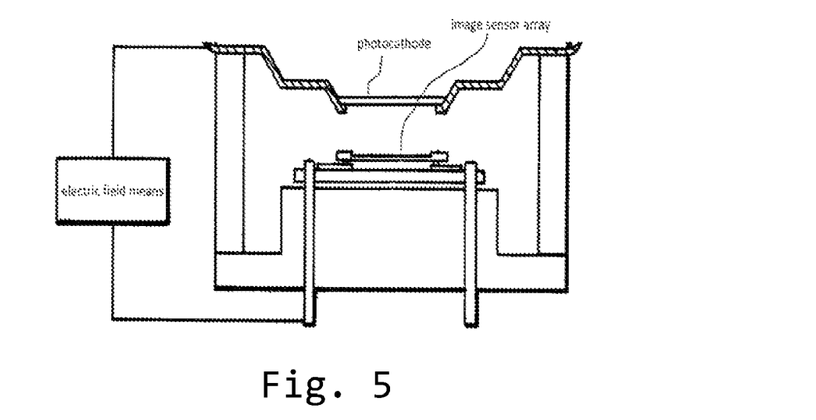
FIG. 5 shows the image sensor array in the vacuum chamber.

FIG. 5 shows the image sensor array 100 as it appears in the vacuum chamber. The array is mounted opposite a photocathode 60, which releases electrons when exposed to light. The electric field means 70 accelerates the electrons toward an anode in the form of the image sensor array.

Figure 3:
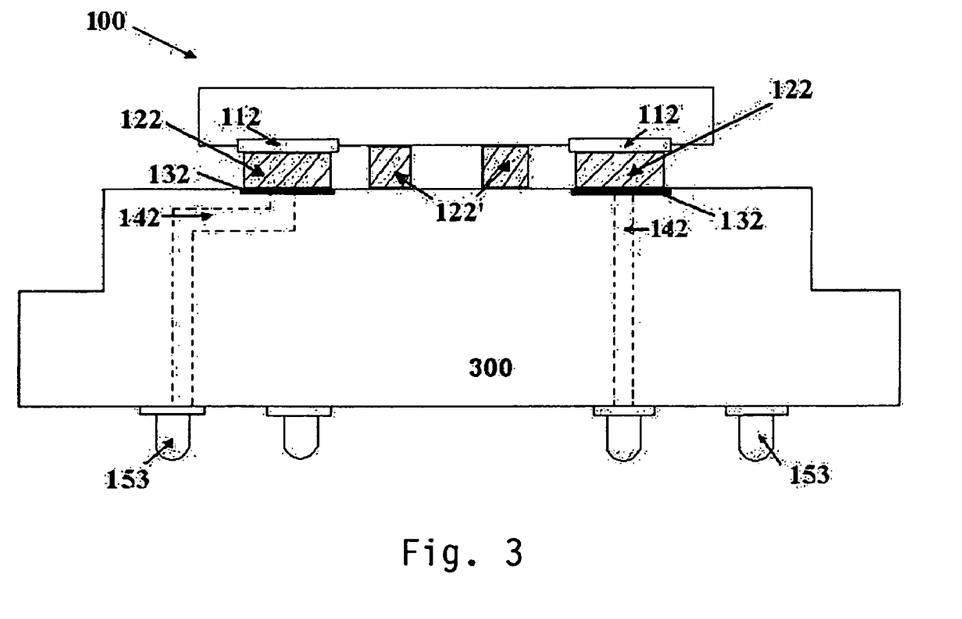
FIG. 3 a third embodiment of an image sensor array die according to the invention.

In FIG. 3 yet a third embodiment is disclosed. In this embodiment the carrier 130-230 and the UHV vacuum header 50-250 (FIGS. 1-2) are formed as one combined part, being an integral part of the vacuum chamber surrounding the whole assembly. The electric connecting means 132-142 electrically connect the image sensor array 110-230 and the carrier/vacuum header 300 via the leads 153 with the necessary equipment outside the vacuum chamber.

With this embodiment a further reduction of the constructional dimensions is obtained.

Figure 4A:
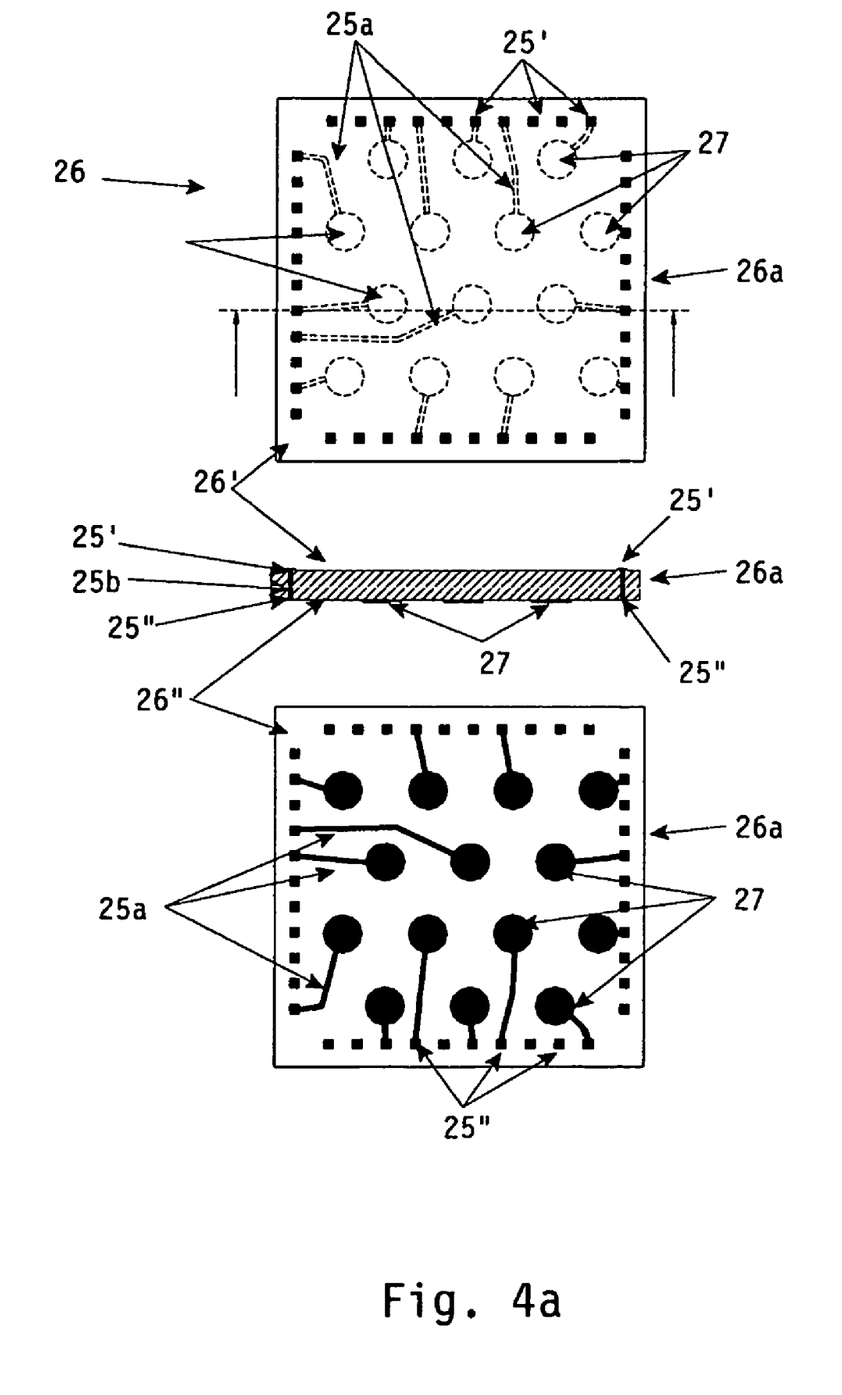
FIGS. 4a-4c enlarged views of specific embodiments of the invention.
Figure 4B:
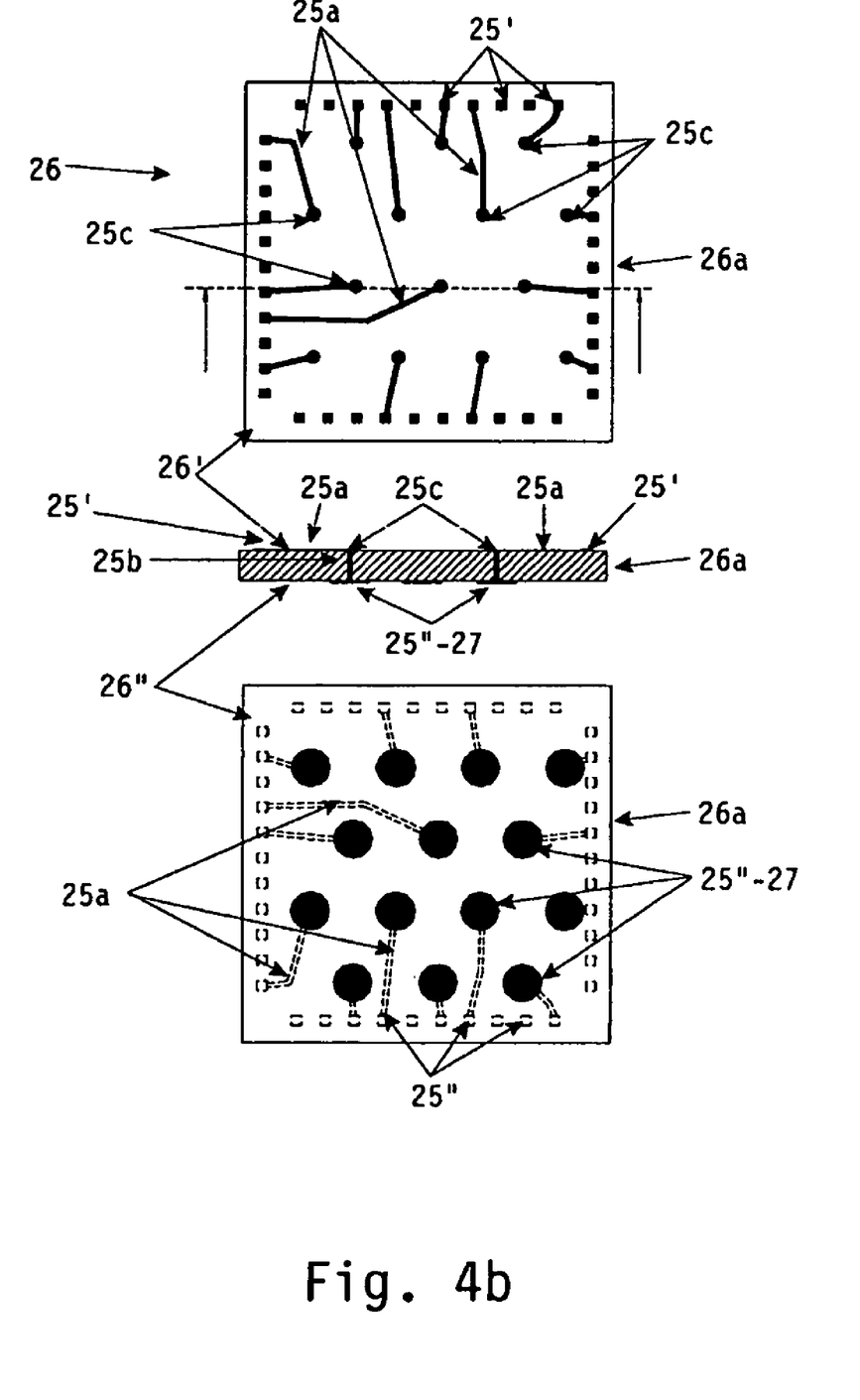
Figure 4C:
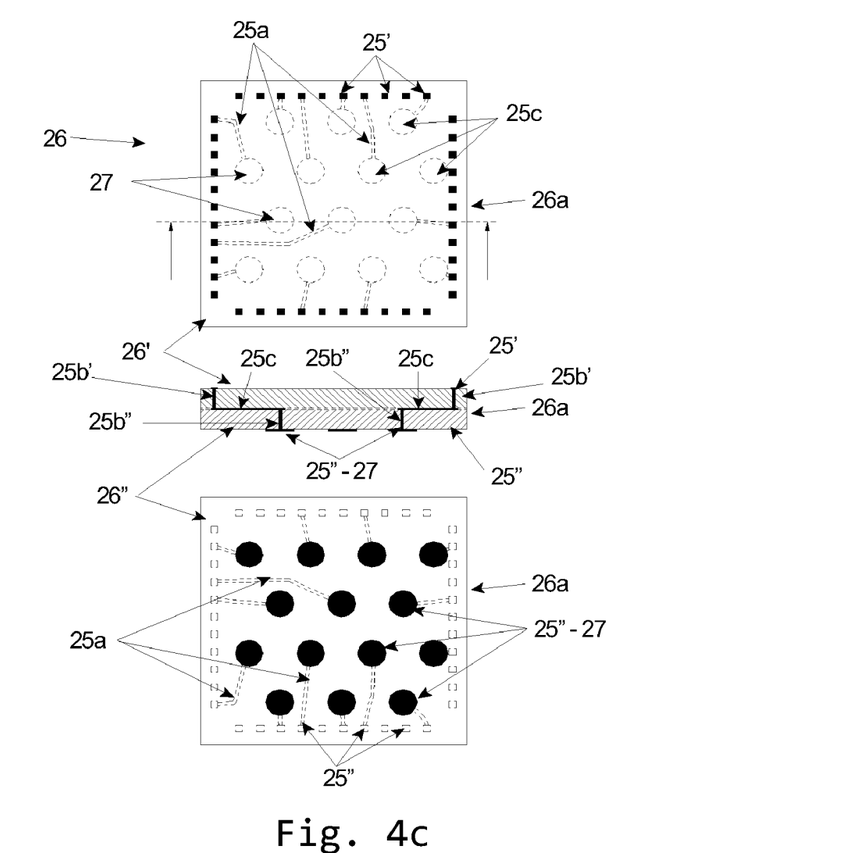

The configuration of the electric connecting means 132-142-132'; 232-233 connecting the image sensor array 100-210 (FIGS. 1-3) and the carrier 130-230-300 can be accomplished in three different ways as depicted in FIGS. 4a-4b-4c. For the sake of clarity in all FIGS. 4a-4c the surface face 26' of said carrier 26 is facing towards the image sensor array, whereas the opposite side 26" of the carrier 26 is facing towards the support 29 and hence away from the image sensor array.

In all FIGS. 4a-4c the upper drawing depicts the surface face 26' of said carrier 26, whereas the lower drawing depicts surface face 26" of said carrier 26. The middle drawing depicts a sectional view of the carrier 26 seen along the line depicted in the upper drawing.

In a first specific embodiment as disclosed in FIG. 4a the electric connecting means 25 for connecting the electric connecting pads 112-213 (FIGS. 1-2-3) of the sensor with the electric connecting pads 27 of the carrier 26 are present on and in the carrier 26. The electric connecting means 25 comprise first auxiliary electric connecting pads 25' distributed on the surface face 26' along the peripheral edge 26a of the carrier 26 having a distribution pattern being identical to the distribution pattern of the electric connecting pads 112-213 of the image sensor array.

In this embodiment the first auxiliary electric connecting pads 25' are passed through the carrier 26 as so-called electric feedthroughs 25b such that they are exposed to the opposite surface face 26" as electric connecting pads 25" having a distribution pattern being identical to the distribution pattern of the first auxiliary electric connecting pads 25a on the surface face 26' (and the electric connecting pads 112-213 of the image sensor array).

Subsequently the electric connecting means 25 (the first auxiliary electric connecting pads 25'-25") are electrically connected to the electric connecting pads 27 of the carrier 26, which are present on the surface face 26", using electric connecting leads 25a distributed on the surface face 26", which opposite surface face is facing towards the carrier 26. Said connecting leads 25a are orientated parallel to the plane of the carrier 26.

In FIG. 4b another embodiment according to the invention is disclosed. Also here the electric connecting means 25 for connecting the electric connecting pads 112-213 of the sensor 100-210 with the electric connecting pads 27 of the carrier 26 are present on and in the carrier 26. The electric connecting means 25 comprise first auxiliary connecting pads 25' distributed on the surface face 26' along the peripheral edge 26a of the carrier 26 having a distribution pattern being identical to the distribution pattern of the electric connecting pads 112-213 of the image sensor array 100-210.

However in this embodiment the first auxiliary electric connecting pads 25' are electrically connected to second auxiliary electric connecting pads 25c by means of electric connecting leads 25a extending parallel to and in the surface face 26' of the carrier 26. The second auxiliary electric connecting pads 25c are present of the surface face 26' facing towards the image sensor array 100-210 and exhibit a distribution pattern that is identical to the distribution pattern of the electric connecting pads 27 of the carrier 26 on the surface face 26" facing away from the sensor 100-210.

Moreover in this embodiment the electric connecting means 25 comprise electric connecting leads 25b extending through the carrier 26 in a direction perpendicular to the plane (26' or 26") of the carrier 26 and electrically connecting the second auxiliary electric connecting pads 25c with the electric connecting pads 27 of the carrier 26. The electric connecting leads 25b are constructed as so-called electric feedthroughs.

In FIG. 4c yet another embodiment is disclosed. As in FIGS. 4a and 4b the electric connecting means 25 for connecting the electric connecting pads 112-213 of the sensor 100-210 with the electric connecting pads 27 of the carrier 26 are present on and in the carrier 26. The electric connecting means 25 comprise first auxiliary connecting pads 25' distributed on the surface face 26' along the peripheral edge 26a of the carrier 26 having a distribution pattern being identical to the distribution pattern of the electric connecting pads 112-213 of the image sensor array 100-210.

In this embodiment the first auxiliary electric connecting pads 25' are electrically connected to second auxiliary electric connecting pads 25c by means of electric connecting leads 25b'-25b" extending perpendicular to the surface face 26'-26" of the carrier 26 and electric connecting leads 25c extending parallel to the surface face 26'-26" of the carrier 26.

More in particular both perpendicular extending leads 25b'-25b" extend from the surface faces 26'-26" respectively until a certain depth within the carrier substrate 26 and are shifted in position relative to each other. The leads 25b" exhibit a distribution pattern identical to the electric connecting pads 27 of the carrier 26, whereas the leads 25b' exhibit a distribution pattern identical to the electric connecting pads 112-213 of the carrier 100-210. Both the leads 25b'-25b" are electrically interconnected using leads 25*c* extending parallel to the surface faces 26'-26" and embedded in the carrier substrate material.

In the embodiments of FIGS. 4*a*-4*c* the distribution pattern of the electric connecting pads 27 of the carrier 26 is different from the distribution pattern of the electric connecting pads 112-213 of the image sensor array 100-210. Moreover the electric connecting pads 27 are redistributed along the surface face 26" of the carrier 26 and are no longer feed sideways away from the sensor/carrier as in the prior art. Instead the electric connecting pads 27 are connected to connecting pins 30 of the support 29 for feeding the electric signals from the sensor 100-210 out of the vacuum chamber of the electron bombarded image sensor array device 20 (FIG. 2).

The invention claimed is:

1. An electron bombarded image sensor array device comprising a vacuum chamber having
   a photocathode capable of releasing electrons into said vacuum chamber when exposed to light impinging on said photocathode,
   electric field means for accelerating said released electrons from said photocathode towards an anode spaced apart from said photocathode in a facing relationship to receive an electron image from said photocathode,
   said anode being constructed as a thinned image sensor array having electric connecting pads distributed according to a pattern along the surface area of said sensor facing away from said photocathode;
   a carrier on which said image sensor array is mounted, said carrier having electric connecting pads distributed according to a pattern to feed electric signals from said image sensor array outside said vacuum chamber towards signal processing means outside the vacuum chamber; and
   electric connecting means for electrically connecting at least one of said electric connecting pads of said image sensor array with at least one of said electric connecting pads of said carrier, characterized in that said electric connecting pads of said carrier are distributed along a surface area of said carrier facing away from said image sensor array.

2. An electron bombarded image sensor array device according to claim 1, characterized in that said surface area of said carrier being identical to the surface area of said image sensor array.

3. An electron bombarded image sensor array device according to claim 2, characterized in that said image sensor array and said carrier having identical surface area dimensions.

4. An electron bombarded image sensor array device according to claim 1, characterized in that said surface area of said carrier being larger than the surface area of said image sensor array.

5. An electron bombarded image sensor array device according to claim 4, characterized in that said electric connecting means comprise first auxiliary electric connecting pads distributed according to a first auxiliary pattern, said first auxiliary pattern being equal to the pattern of said electric connecting pads of said image sensor array.

6. An electron bombarded image sensor array device according to claim 5, characterized in that said first auxiliary electric connecting pads are distributed along the surface area of said carrier facing towards said image sensor array.

7. An electron bombarded image sensor array device according to claim 5, characterized in that said first auxiliary electric connecting pads are distributed along the surface area of said carrier facing away from said image sensor array.

8. An electron bombarded image sensor array device according to claim 5, characterized in that said electric connecting means comprise second auxiliary electric connecting pads distributed according to a second auxiliary pattern along the surface area of said carrier facing towards said image sensor array, said second auxiliary pattern being equal to the pattern of said electric connecting pads of said carrier.

9. An electron bombarded image sensor array device according to claim 8, characterized in that second auxiliary electric connecting pads are distributed along the surface area of said carrier facing towards said image sensor array.

10. An electron bombarded image sensor array device according to claim 5, characterized in that said electric connecting means comprise electric connecting leads for connecting said first auxiliary electric connecting pads with said second auxiliary electric connecting pads and/or said electric connecting pads of said carrier.

11. An electron bombarded image sensor array device according to claim 10, characterized in that said electric connecting leads extend at least partly in a direction parallel to the plane of the carrier.

12. An electron bombarded image sensor array device according to claim 10, characterized in that said electric connecting leads extend at least partly in a direction perpendicular to the plane of the carrier.

13. An electron bombarded image sensor array device according to claim 1, characterized in that the carrier forms an integral part of the vacuum chamber.

14. An electron bombarded image sensor array device according to claim 1, characterized in that the carrier is electrically mounted to a vacuum header, said vacuum header forming an integral part of the vacuum chamber.

\* \* \* \* \*